United States Patent [19]

Kawata et al.

[11] Patent Number: 4,744,054
[45] Date of Patent: May 10, 1988

[54] SEMICONDUCTOR DEVICE WITH A MEMORY CIRCUIT

[75] Inventors: Kazuhide Kawata; Hiroyuki Suzuki, both of Tokyo, Japan

[73] Assignee: NEC Corporation, Tokyo, Japan

[21] Appl. No.: 702,288

[22] Filed: Feb. 15, 1985

[30] Foreign Application Priority Data

Feb. 16, 1984 [JP] Japan .................................. 59-27473

[51] Int. Cl.⁴ .............................................. G11C 11/40
[52] U.S. Cl. .................................... 365/104; 365/178; 365/182; 364/200
[58] Field of Search ............... 365/104, 178, 174, 182, 365/184; 364/200

[56] References Cited

U.S. PATENT DOCUMENTS 4,057,787 11/1977 Heuer et al. ...................... 365/104
4,059,826 11/1977 Rogers ................................. 365/104

Primary Examiner—Terrell W. Fears
Attorney, Agent, or Firm—Sughrue, Mion, Zinn, Macpeak & Seas

[57] ABSTRACT

A semiconductor device has a first ROM and a second ROM on a single semiconductor chip. To write information in the first ROM, a contact mask pattern is used by which wirings are formed on the chip, while information is written in the second ROM when memory transistors are formed on the chip. The first ROM stores the non-commonly used information of the program to be stored, or a specific user supplied program, and the second ROM stores predetermined and commonly used information of the program to be stored. Thus, a semiconductor device having a fixed memory in which a large capacity of information is stored can be provided to a user within a short period of time.

7 Claims, 4 Drawing Sheets

SEMICONDUCTOR DEVICE WITH A MEMORY CIRCUIT

BACKGROUND OF THE INVENTION

1. Field of the Invention

The present invention relates to a semiconductor device with a memory circuit, and more particularly to a semiconductor device having at least one read-only memory (ROM) including a plurality of memory cells (bits) on a single semiconductor chip.

2. Description of the Prior Art

Generally, there are two types of read only memory. One is a ROM in which information can be written after a semiconductor chip is encapsulated by a packaging member, and the other is a ROM in which information can not be written after packaging. The ROM of the present invention belongs to the latter type. The ROM of the latter type is called "a mask ROM" and stores information before the chip is encapsulated. Information is written into the ROM by a masking process during semiconductor manufacturing. That is, information is stored in a permanent manner according to a mask pattern.

There are two types of mask ROMs. One is called "a contact ROM" where the bit information to be stored is determined according to whether a memory transistor is connected to a bit (digit) line or not. The ROM of this type has memory transistors at all of the cross points of the address (word) lines and bit (digit) lines arranged in matrix shape, but only the memory transistors selected by the mask pattern are connected to the respective bit lines. It is well known in the mask ROM that a memory transistor acts as an element for varying the potential of a bit line. Therefore, if a memory transistor at a given location designated by an address is conencted to a bit line, the potential of the bit line is varied, while if another memory transistor designated by an address is not connected to a bit line, the potential of the bit line is not varied. Thus, it is determined whether the stored bit information is "1" or "0". In this case a semiconductor device maker must produce a contact mask according to a program or another information provided by a user. However, since the maker can produce memory transistors before the program or other information to be stored in the ROM is provided by the user, the maker can provide a semiconductor device with a mask ROM in which the necessary information has been stored for the user within a short period of time. That is, this type of ROM has an advantage in that the turn around time (TAT) is short. On the other hand, the ROM of this type has a disadvantage in that the ROM is limited to a small capacity since a contact area is required for each bit as described in detail hereinafter.

In contrast, a mask ROM of the other type is not dependent on the contact pattern, but depends on the memory transistor itself. In the ROM of this type, information is stored depending on whether or not a memory transistor for charging (or discharging) the potential of a bit line in response to an address signal is produced at a cross point of a bit line and a word line. If a memory transistor operating in response to an address signal is produced at this point, the potential of the bit line varies, while if a memory transistor is not produced or if a memory transistor does not operate in response to the address signal, the potential of the bit line does not vary. Thus, bit information can be stored in this ROM the same as in the above mentioned contact ROM.

This ROM can store a large quantity of information since the contact area is not required. However, a maker can not produce memory transistors on the chip before a program or another information to be stored is provided by the user, so that a long turn around time is required.

Conventionally, mask ROMs of the above two types are used in accordance with the user's request. Namely, in the case where the quantity of information to be stored is small and where the user desires to use the semiconductor device with the mask ROM as quickly as possible, the former mask ROM is employed in general. In the case of a large quantity of information, that is, a long program, a large table storing predetermined information, or the like, the latter mask ROM is used.

Now, it is assumed that a mask ROM storing 2k words of information (16 bits/word) is required. If the former type ROM is used, one or two weeks are required to provide a semiconductor device with the ROM to the user, however the size of this ROM is as about three times that of the latter type ROM. Therefore, this type ROM is inadequate for large capacity information storage or for semiconductor devices which need circuit elements other than ROMs, such as a microcomputer. On the other hand, though the latter ROM can store about three times as much information as the former ROM, six to eight weeks are required to deliver the semiconductor device to the user. Therefore, the user can not use the device quickly.

SUMMARY OF THE INVENTION

An object of the present invention is to provide a semiconductor device having a mask ROM with a large capacity, within a short turn around time.

Another object of the present invention is to provide a memory suitable for a semiconductor device including circuitry other than the memory such as a single chip microcomputer.

A semiconductor device according to the present invention has both a first mask ROM which stores information according to a contact pattern which determines whether a memory transistor is to be connected to a bit line, and a second ROM which stores information according to whether a memory transistor operable in response to an address signal applied through a word line is produced at a cross point of a word line and a bit line. The first and second ROMs are built on the same semiconductor chip. In other words, the semiconductor device of the present invention has both the conventional former type ROM (first ROM) and the latter type ROM (the second ROM) on a single semiconductor chip. The first ROM is used to store common, specialized information while the second ROM is used to store information common to a plurality of systems employing a semiconductor device. For example, a user program or a non-commonly used program such as an application program is stored in the first ROM. Commonly used programs or information, such as an operating system (OS), a fixed subroutine program, a test program, and tables, are stored in the second ROM.

According to the present invention, predetermined information to be stored, is preliminary written into the second ROM before the program is provided by the user, while one or more of a variety of programs the user of the IC designates are written into the first ROM. A portion of the address space which can be used in the semiconductor device is assigned to the second ROM, and the remainder portion of the address space is assigned to the first ROM, in a manner such that the two ROMs can be easily accessed by a well known addressing method in use.

According to the present invention, a device maker can prepare a semiconductor device in which the first ROM capable of receiving necessary information therein and the second ROM, into which there has been written predetermined information are provided, before a user program is provided by the user. Therefore, the maker can deliver a semiconductor device having a large capacity memory within a short period of time. For example, if 1k words of information is stored in the first and second ROMs, respectively, the size of the ROM can be reduced to half that of the conventional former type. Further, the turn around time can be decreased by half as compared with the conventional latter type.

DETAILED DESCRIPTION OF THE PREFERRED EMBODIMENT

Figure 1:
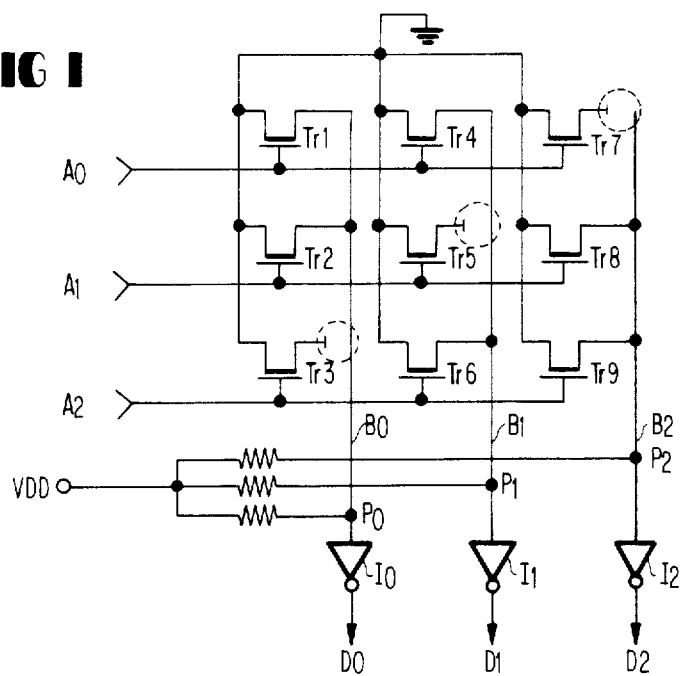
FIG. 1 shows a circuit diagram of an example of the first type ROM.

FIG. 1 shows a circuit diagram of an example of the first type ROM, in which three word lines A0, A1 and A2 and three bit lines B0, B1 and B2 are arranged in a matrix shape. Nine transistors Tr1 to Tr9 are formed at each of the cross points of the word lines and the bit lines, respectively. Source (or drain) ends of the transistors Tr1 to Tr9 are connected to ground in common. The bit line B0 is connected to drain (or source) ends of the transistors Tr1 and Tr2. In a similar way, drain (or source) ends of the transistors Tr4, Tr6 and Tr8, Tr9 are connectd to the bit lines B1 and B2, respectively. However, drain (or source) ends of the transistors Tr3, Tr5 and Tr7 are opened, or disconnected from the respective bit lines B0 to B2. The bit lines B0 to B2 are coupled to a positive power source ($V_{DD}$) via resistors, respectively, and are charged at a positive potential. Data D0 to D2 are derived through inverting buffer circuits I0 to I2, respectively.

Now, if the word line A0 is selected as a result of address decoding, a high level signal "1" is applied only to the word line A0. Thus, the transistors Tr1, Tr4 and Tr7 are turned on, while the remaining transistors are turned off. As a result, the bit lines B0 and B1 are electrically coupled to ground and their positive potentials are discharged. However, the bit line B0 holds a positive potential since the transistor Tr7 is not connected to the bit line B2. In this condition, data 1, 1, 0 are derived from the buffer circuits I0 to I2, respectively. In a similar way, when address lines A1 and A2 are selected, data 0, 1 and 0,1,1 are derived, respectively.

According to this ROM, information can be stored depending on the contact mask pattern, which effects the selective connection of the transistors to the bit lines. With this device, all of the transistors are formed at predetermined locations before the contact mask pattern corresponding to information to be stored is produced.

Figure 2:
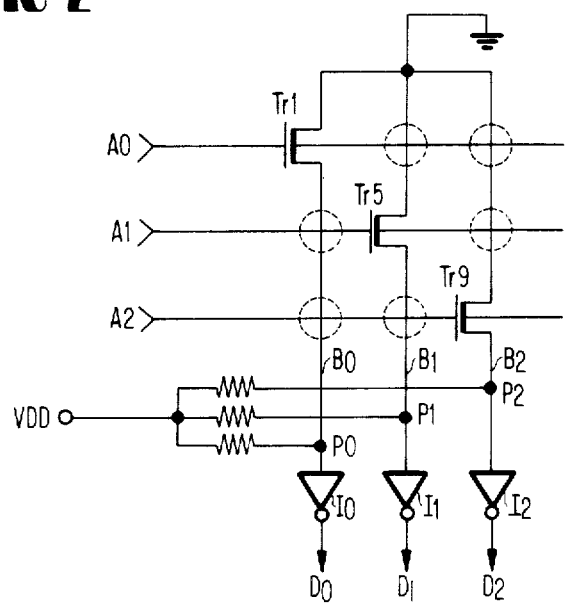
FIG. 2 shows a circuit diagram of an example of the second type ROM.

FIG. 2 shows a circuit diagram of the second type ROM, in which three address lines A0 to A2 and three bit lines B0 to B2 are arranged in a matrix shape. The bit lines are charged to a high voltage potential by means of $V_{DD}$. The data (D0, D1, D2) is derived through inverting buffer circuits I0, I1 and I2. Transistors Tr1, Tr5 and Tr9 are formed at cross locations of lines A0 and B0, A1 and B1 and A2 and B2, respectively. However, at the remaining cross locations (shown by dotted circle lines) no transistor is formed, that is, the bit line portions are electrically coupled in series.

Now, if the address line A0 is selected, 1, 0, 0 are read out as the output data D0, D1 and D2. Further, if the address lines A1 and A2 are selected, respectively, 0, 1, 0 and 0, 0, 1 are read out. Thus, information can be stored in the ROM according to the pattern of forming the transistors at the cross points.

Figure 3:
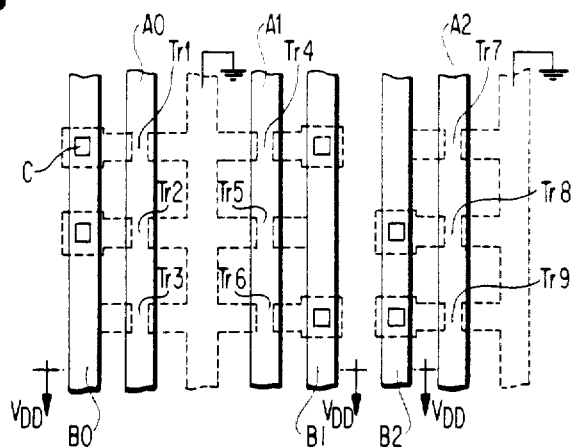
FIG. 3 shows a plane view of the ROM shown in FIG. 1.
Figure 4:
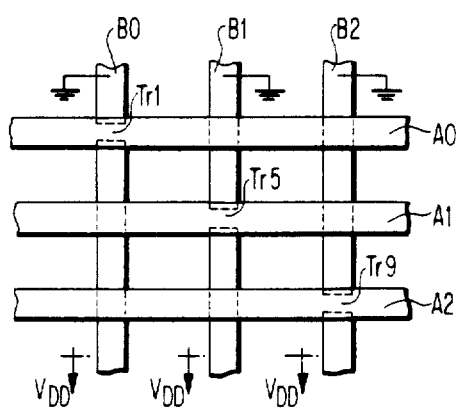
FIG. 4 shows a plane view of the ROM shown in FIG. 2.

FIG. 3 shows a plane view of the ROM shown in FIG. 1 which is formed on a semiconductor chip, while FIG. 4 shows a plane view of the ROM shown in FIG. 2. The addres lines A0 to A2 are formed of conductors such as aluminum or polycrystalline silicon. The bit lines B0 to B2 are formed by diffusion layers. The bit lines B0 to B2 of FIG. 4 can be formed by diffusion layers, while the bit lines B0 to B2 of FIG. 3 are formed by conductive members similarly to the address lines.

In FIG. 3, all transistors Tr1 to Tr9 are formed on the semiconductor substrate. Further, transistors Tr1, Tr2, Tr4, Tr6, Tr8 and Tr9 are connected to their respective bit lines via a contact hole C. As shown, the transistors Tr3, Tr5 and Tr7 are not so connected. Thus, the ROM circuit of FIG. 1 is formed on the chip. On the other hand, in FIG. 4, only three transistors Tr1, Tr5 and Tr9 are formed as shown. Therefore, when these transistors are turned on, $V_{DD}$ is coupled to GND through the bit lines.

As shown in FIGS. 3 and 4, the size of the second ROM (FIG. 4) can be made smaller than that of the first ROM (FIG. 3). However, the writing of information into the first ROM can be performed at a later manufacturing step than in the case of the second ROM. Therefore, its turn around time is short in comparison with the second ROM.

Figure 5:
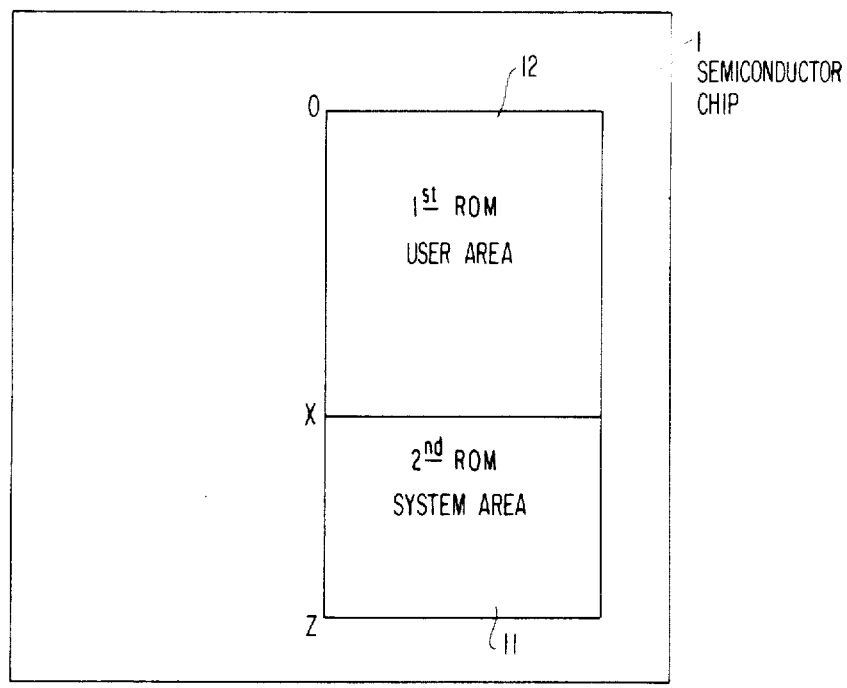
FIG. 5 shows a diagram of an embodiment of the present invention.

FIG. 5 shows a block diagram of a ROM on a semiconductor chip according to an embodiment of the present invention. A predetermined address space (address 0 - address Z) is assigned to the ROM. The ROM is divided into two sections 11 and 12. The section 12 is used as a user area and is designated by addresses 0 to X, while the section 11 is used as a system area and is designated by address X+1 to Z. The above mentioned first ROM is formed in the section 12, and the second ROM is formed in the section 11. In the section 11, predetermined information, such as the operating system program, a test program, an evaluation program, constant tables, character generator tables, function tables, subroutine programs, or the like, are stored, while user programs, and non-commonly used programs, or the like are stored in the section 12.

A maker can stock semiconductor chips incorporating the ROM of FIG. 5, including the section 11 in which necessary information has already been stored, and the section 12 which is in a condition such that information can be readily written therein. Thus, a semiconductor device having a mask ROM with a large information capacity can be manufactured within a short period of time.

Figure 6A:
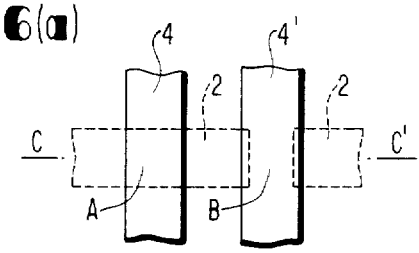
FIGS. 6 made up of FIGS. 6a and 6b and 7 made up of FIGS. 7a and 7b are device structure diagrams according to the second ROM.
Figure 6B:
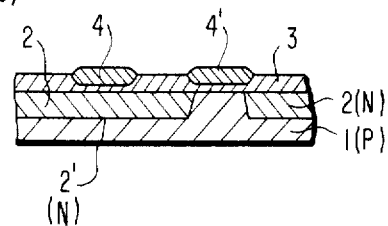

FIG. 6(a) shows a plane view of an example of a part of the second type ROM formed in the section 11 of FIG. 5. FIG. 6(b) shows a sectional view along line C—C' of FIG. 6(a). In FIG. 6, two bit locations A and B are illustrated. Address lines 4 and 4' are formed on a gate insulating film (e.g. SiO2), respectively. A bit line 2 is formed in a P-type semiconductor substrate 1 by a diffusion technique. Source and drain regions of the transistors can be used as portions of the bit line 2.

In manufacturing the ROM, at first the source and drain regions are formed in the P-type substrate by diffusing an N-type impurity. At this time, the N-type impurity can also be diffused under the gate film of the bit location A. In this case, a transistor is formed at the location B, but is not formed at the location A. At the location A, the N-type source region is connected to the N-type drain region via a same conductivity type (N-type) diffusion layer 2'. Further, at the location A, the diffusion layer 2' may be formed either before or after the source and drain regions are formed, by diffusion or ion-implantation techniques. Thereafter gate electrodes (word lines) and bit lines are formed.

Figure 7A:
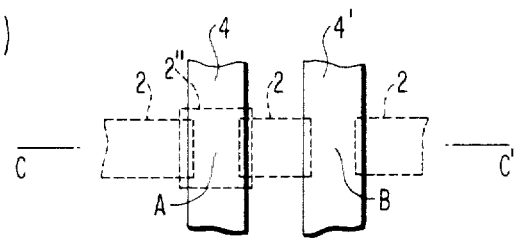
Figure 7B:
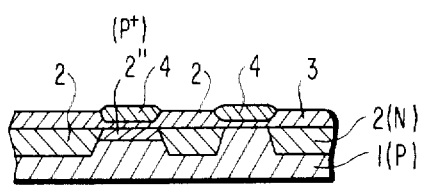

FIG. 7 shows another example of the second type ROM. In this example, a p+-type impurity is introduced in a region 2" between source and drain regions. In this case, although a transistor is formed at the location A, the transistor is not activated by an address signal applied to the word (address) line 4 because the threshold level of this transistor becomes higher than that of the transistor at the location B. This type memory must be used as an NOR type ROM. The threshold level of the transistor is raised by making the gate film under the word line 4 thicker than the gate film under the word line 4'.

Figure 8A:
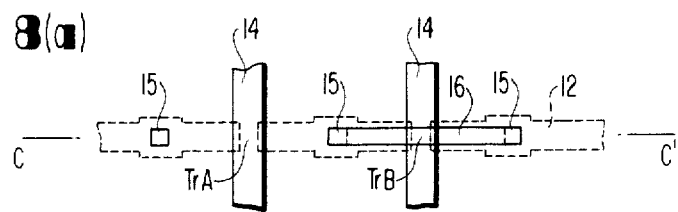
FIG. 8 made up of FIGS. 8a and 8b is a device structure diagram of the first ROM.
Figure 8B:
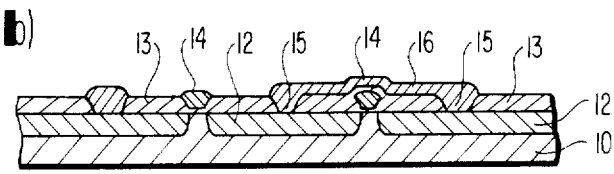

FIG. 8 show an example of the first type ROM (the contact type ROM). In FIG. 8, two transistors TrA and TrB are preliminarily formed on a P-type substrate, in which N-type source and drain regions 12 are formed, and word lines 14 and 14' are also formed via gate films. This memory is used in the section 12 of the device shown in FIG. 5. In this case, information is written by connecting source regions to drain regions using a wiring pattern 16 according to the program to be stored.

As shown in the drawings, both the first ROM, in which information is written according to a contact pattern, and the second ROM, in which information is stored according to whether a transistor is formed at a particular location or not, or according to whether a first type transistor having a low threshold level or a second type transistor having a high threshold transistor is formed, selectively, are formed on the same semiconductor chip. The device of the invention can be used as a memory device or in another semiconductor device, such as a microcomputer.

What is claimed is:

1. A single-chip microcomputer device, comprising; semiconductor memory means provided on said chip, said memory means having an address space divided into first and second sections, said first section comprising a user area and said second section comprising a system area;

said first section being comprised of a first ROM memory of the type which is programmed when wiring layers are formed on said chip, and said second section being comprised of a second ROM memory of the type in which information is written when memory cells are formed on said chip.

2. A microcomputer device as claimed in claim 1, wherein information to be stored in said first ROM comprises at least a user program, and wherein information to be stored in said second ROM comprises at least a system program.

3. A microcomputer device as claimed in claim 2, wherein said system program is prerecorded during initial manufacture of said microcomputer device, and wherein said user program is subsequently defined by further customized processing of said chip.

4. A single chip microcomputer of the type incorporating a read only memory, comprising;
first and second read only memory sections, said first section comprising a user area comprised of a ROM of the type in which information is written according to whether a preformed transistor at a cross location of a word line and a bit line is connected to said bit line, and wherein said second section comprises a system memory area comprised of a ROM of the type in which information is written according to whether a transistor is formed at a cross location of a word line and a bit line.

5. A single chip microcomputer having an on-board read only memory, comprising;
first and second ROM memories within the address space of said microcomputer and formed on said chip, said first ROM memory defining a user memory area and being of the type wherein information is written in accordance with whether or not a transistor formed at a location where a word line crosses a bit line is connected to said bit line, and wherein said second ROM memory defines a system memory area and comprises a memory of the type having first type transistors activated in response to an address signal applied to a word line and second type transistors non-activated in response to an address signal, said first and second type transistors being selectively formed according to the information to be stored.

6. A single chip microcomputer device, comprising; read only memory means formed on said chip and addressable by said microcomputer;
said read only memory means comprising a first memory section of the type in which information storage is effected by introducing an impurity into selected portions of a semiconductor substrate, said first memory section comprising a system memory area, and
a second memory section of the type in which information is stored according to a mask pattern via which source regions of selected transistors are connected to drain regions thereof, said second memory section comprising a user memory area.

7. A single chip microcomputer having an on-board read only memory, comprising;
first and second ROM memories within the address space of said microcomputer and formed on said chip, said first ROM memory defining a user memory area and being of the type wherein information may be written by controlling the connectivity of pre-formed transistors on a semiconductor substrate, and wherein said second ROM memory defines a system memory area and comprises a memory of the type wherein transistors in a memory cell array are formed or not formed according to the desired content of said memory.

* * * * *

UNITED STATES PATENT AND TRADEMARK OFFICE
CERTIFICATE OF CORRECTION

PATENT NO. : 4,744,054

DATED : May 10, 1988

INVENTOR(S) : KAWATA

It is certified that error appears in the above-identified patent and that said Letters Patent is hereby corrected as shown below:

Column 4, line 2, after "data" insert --1,--

Column 4, line 30, delete "addres" and insert --address--

Signed and Sealed this

Thirty-first Day of January, 1989

*Attest:*

DONALD J. QUIGG

*Attesting Officer*  Commissioner of Patents and Trademarks